(12) United States Patent
Akiyama

(10) Patent No.: US 7,348,623 B2
(45) Date of Patent: Mar. 25, 2008

(54) SEMICONDUCTOR DEVICE INCLUDING A MIM CAPACITOR

(75) Inventor: Kazutaka Akiyama, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/657,119

(22) Filed: Sep. 9, 2003

(65) Prior Publication Data

US 2005/0006771 A1 Jan. 13, 2005

(30) Foreign Application Priority Data

Jul. 9, 2003 (JP) ............... 2003-194419

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/303; 257/306; 257/E27.086

(58) Field of Classification Search ............ 257/310, 257/311, 295, 303, 484, 296, 306, E27.086; 438/240, 239
See application file for complete search history.

(56) References Cited

U.S. PATENT DOCUMENTS

| | | | | |
|---|---|---|---|---|
| 6,727,542 B2* | 4/2004 | Kim et al. | .................. | 257/306 |
| 6,784,474 B2* | 8/2004 | Ogawa et al. | ............... | 257/295 |
| 6,809,364 B2* | 10/2004 | Matsuoka et al. | ........... | 257/296 |
| 6,906,374 B2* | 6/2005 | Tanaka | ........................ | 257/306 |
| 2002/0127792 A1 | 9/2002 | Yoshitomi et al. | .......... | 438/239 |
| 2003/0057558 A1 | 3/2003 | Akiyama | ..................... | 257/759 |
| 2004/0092095 A1* | 5/2004 | Nguyen et al. | ............. | 438/627 |

FOREIGN PATENT DOCUMENTS

| | | |
|---|---|---|
| JP | 2002-134506 | 5/2002 |
| JP | 2002-270769 | 9/2002 |
| JP | 2002-367996 | 12/2002 |
| JP | 2003-17575 | 1/2003 |
| JP | 2003-086695 | 3/2003 |

OTHER PUBLICATIONS

Japanese Office Action entitled, "Notification of Reasons for Rejection," mailed by the Japanese Patent Office on Jun. 6, 2006 in counterpart Japanese Application No. 2003-194419.

* cited by examiner

*Primary Examiner*—Phat X Cao
(74) *Attorney, Agent, or Firm*—Finnegan, Henderson, Farabow, Garrett & Dunner, L.L.P.

(57) ABSTRACT

A semiconductor device includes: a semiconductor substrate; a first wiring formed above the semiconductor substrate with a first insulating film interposed therebetween; an MIM capacitor formed above the first insulating film; a second insulating film formed to cover the MIM capacitor; a second wiring formed on the second insulating film; and a guard ring buried in the second insulating film to surround the MIM capacitor.

14 Claims, 5 Drawing Sheets

SEMICONDUCTOR DEVICE INCLUDING A MIM CAPACITOR

CROSS-REFERENCE TO RELATED APPLICATION

This application is based on and claims the benefit of priority from the prior Japanese Patent Application No. 2003-194419, filed on Jul. 9, 2003, the entire contents of which are incorporated herein by reference.

BACKGROUND OF THE INVENTION

1. Field of the Invention

This invention relates to a semiconductor device with an MIM capacitor and a method of fabricating the same.

2. Description of Related Art

In conventional semiconductor devices, aluminum (Al) wirings are usually employed as metal wirings for electrically connecting between elements formed on a silicon substrate. An Al film deposited on an insulating film is patterned by photolithography and anisotropic etching processes. However, as devices and wirings are more miniaturized, It becomes to be difficult to not only form low resistance wirings but also pattern the Al film by anisotropic etching or bury an insulating film at the space between the wirings. From these viewpoints, there has been provided a cupper (Cu) wiring technique with a damascene process for forming metal wirings in place of Al wirings.

On the other hand, capacitors are indispensable for an LSI in which analog circuits are integrated. In general, as an analog circuit-use capacitor, an MIM (Metal-Insulator-Metal) capacitor, which may be statically formed with a large capacitance, is used. Since the MIM capacitor is formed to have top and bottom metal electrodes, its forming process may be partially shared with a Cu multi-layer wiring forming process with a damascene process. There has already been provided various process techniques for coexisting MIM capacitors and Cu damascene wirings (refer to, for example, Japanese Patent Application Laid Open (kokai) No. 2002-270769).

In a case that an analog circuit with an MIM capacitor serves as a high-frequency circuit, in order to achieve high-speed performance by preventing transmitted signals from deterioration, it is required to possibly decrease capacitances between multi-layer wirings, and use an interlayer insulating film with a low dielectric constant for the purpose. However, low dielectric constant insulating films are generally inferior in step-coverage. To improve the step-coverage of the insulating film covering the MIM capacitor, it is effective to use a film deposition method with a high-density plasma (HDP)-type CVD apparatus. However, the insulating film deposited by the above-described method is in general in high water-absorbability and high thermal contractibility. These properties cause the contact between the insulating film and metal films or the like to be deteriorated, thereby easily resulting that the metal corrosion and peeling of the film are brought.

Therefore, it is not easy to achieve high reliability of the MIM capacitor which is integrated on a semiconductor device with Cu multi-layer interconnections.

SUMMARY OF THE INVENTION

According to one aspect of the present Invention, there is provided a semiconductor device including: a semiconductor substrate; a first wiring formed above the semiconductor substrate with a first insulating film interposed therebetween; an MIM capacitor formed above the first insulating film; a second insulating film formed to cover the MIM capacitor; a second wiring formed on the second insulating film; and a guard ring buried in the second insulating film to surround the MIM capacitor.

According to another aspect of the present invention, there is provided a method of fabricating a semiconductor device including: forming a first wiring above a semiconductor substrate with a first insulating film interposed therebetween; forming an MIM capacitor above the first insulating film; forming a second insulating film to cover the MIM capacitor; and burying a second wiring in the surface of the second insulating film, and a guard ring in the second insulating film to surround the MIM capacitor.

DETAILED DESCRIPTION OF THE EMBODIMENTS

An illustrative embodiment of this invention will be explained with reference to the accompanying drawings below.

Figure 1:
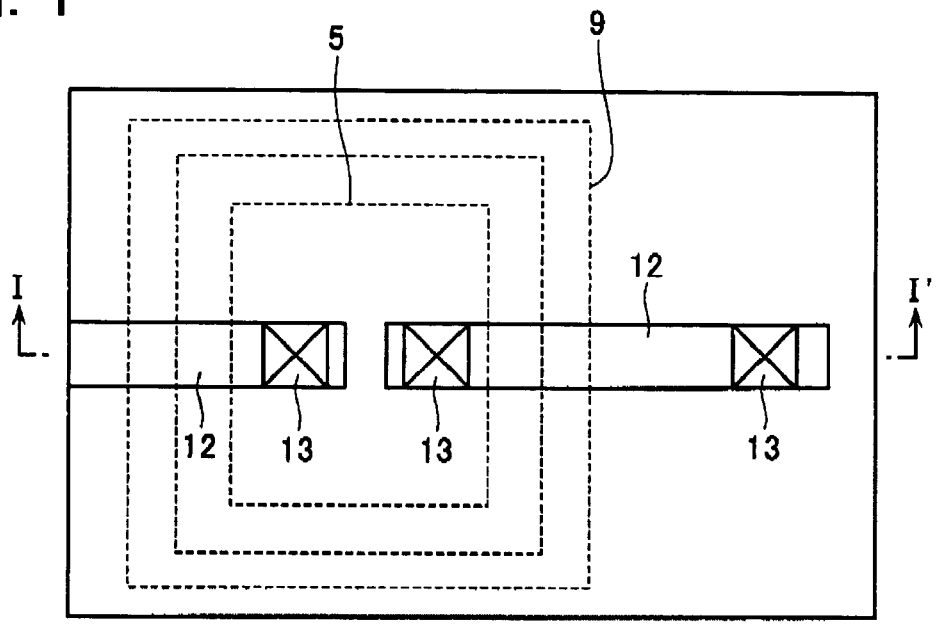
FIG. 1 shows a plan view of a semiconductor device in accordance with an embodiment of the present invention.
Figure 2:
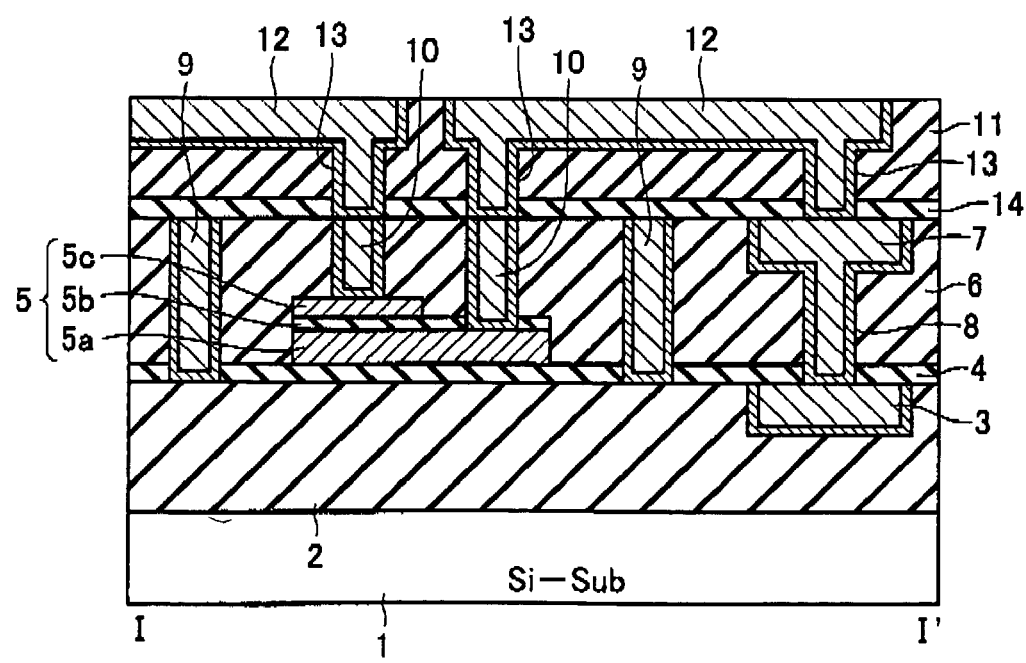
FIG. 2 shows a sectional view the device taken along I-I' line of FIG. 1.

FIG. 1 is a plan view of a semiconductor device according to an embodiment, in which Cu multi-layer wirings and an MIM capacitor are integrated. FIG. 2 is a cross sectional view of the device as being taken along I-I' line of FIG. 1. On a silicon substrate 1, device elements such as transistors or the like (not shown) are formed. A first wiring (or interconnection) 3 is formed on a first interlayer insulating film 2 formed over the substrate 1. The interlayer insulating film 2 is formed of a silicon oxide film, the surface of which is planarized. The first wiring 3 is formed of a Cu layer buried in the insulating film 2 by a damascene process. This wiring 3 has a barrier metal underlying the Cu layer, which is formed of, for example, tantalum (Ta) and/or tantalum nitride (TaN). In practice, the wiring 3 is formed by a dual damascene process to be connected to a device on the substrate 1 via a contact hole (not shown in FIG. 1).

A block insulating film 4 is formed of a silicon nitride (SiN) on the interlayer insulating film 2 to cover the first wiring 3 formed thereon. Formed on this block insulating film 4 is an MIM capacitor 5. The MIM capacitor 5 has a structure that bottom electrode 5a, dielectric film 5b and top electrode 5c are stacked. The bottom and top electrodes 5a and 5c are formed of, for example, titanium nitride (TiN), and the dielectric film 5b is formed of, for example, SiN.

The MIM capacitor 5 is covered by a second interlayer insulating film 6, the surface of which is planarized (i.e., made flat). The interlayer insulating film 6 Is formed of a dielectric film whose relative dielectric constant (k) is lower than that of a dTEOS film (i.e., a normal silicon oxide film formed from TEOS by a dual plasma CVD process). Preferably, the relative dielectric constant (k) of the interlayer insulating film 6 is selected to be equal to or less than 3.5. In detail, the interlayer insulating film 6 is one selected within FSG (Fluoro-Silicate Glass) film which is a fluorine (F) containing silicon oxide film, carbon (C) containing silicon oxide film and porous silicon oxide film with pores formed therein.

On the interlayer insulating film 6, a second wiring 7 is formed by a dual damascene process. The second wiring 7 is a Cu layer buried in a top surface of the interlayer insulating film which is planarized. The wiring 7 has a barrier metal underlying it, which is formed of, for example, tantalum (Ta) and/or tantalum nitride (TaN). The second wiring 7 is connected to the first wiring 3 through a wiring via hole 8. Furthermore, buried in the interlayer insulating film 6 are contact plugs 10 which are contacted to the bottom and top electrodes 5a and 5c of the MIM capacitor 5. The contact plugs 10 are formed of the same material as the second wiring 7 to be buried in holes formed at the same time as the via hole 8 in the interlayer Insulating film 6.

In addition, in the interlayer insulating film 6, a guard ring 9 is buried to surround the MIM capacitor 5. This guard ring 9 is not connected to the MIM capacitor 5 or the wirings. In this embodiment, the guard ring 9 in a metal ring formed of the same material and at the same process as the second wiring 7 so as to penetrate through the interlayer insulating film 6. The width of the guard ring 10 may be selected in a range of 0.1 to 1 μm, more preferably be selected to be about 1 μm. This guard ring 9 functions not only as a barrier for suppressing or blocking crack progressing in the interlayer insulating film 6 from the peripheral portion of the MIM capacitor 5 but also as a barrier for protecting water carried into the interlayer insulating film 6 from the side surface of the chip from being diffused into the MIM capacitor 5.

Over the interlayer insulating film 6, in which the second wiring 7, contact plugs 10 and metal ring 9 are formed, a block insulating film 14 formed of SIN and a third interlayer insulating film 11 formed of a TEOS-SiO₂ film are formed to cover the wiring 7, contact plugs 10 and metal ring 9. Third wirings 12 are formed on the interlayer insulating film 11 by a dual damascene process to electrically connect between the second wiring 7 and the MIM capacitor 5. The third wirings 12 are Cu layers buried in a planarized top surface of the interlayer insulating film 11. The wirings 12 have underlying barrier metals formed of, for example, Ta and/or TaN. The third wirings 12 are connected to the second wiring 7 and contact plugs 10 through via holes 13. Tat is, the MIM capacitor 5 and the second wiring 7 are electrically connected each other by the third wiring 12. Alternatively, the third wirings 12 may be formed to electrically connect the MIM capacitor 5 to the first wiring 3.

Figure 3:
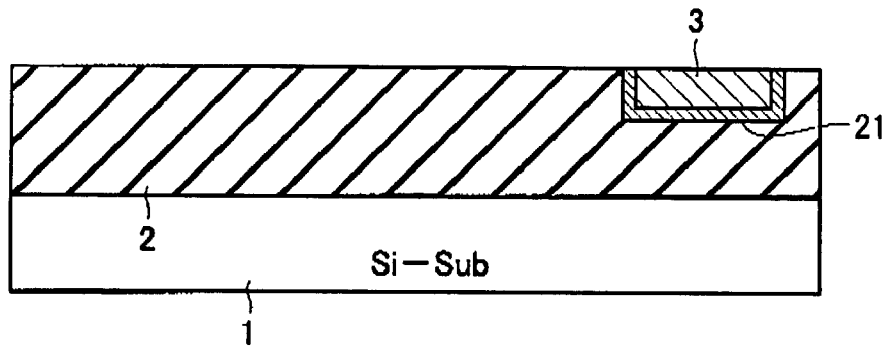
FIG. 3 shows a sectional view of the step of forming the first wiring on the first interlayer insulating film according the embodiment.

Referring to FIGS. 3 to 9, the fabrication process of this device will be described in detail bellow. FIGS. 3 to 9 show the respective sectional views each corresponding to that of FIG. 2. As shown in FIG. 3, a SiO₂ film an the first interlayer insulating film 2 is deposited on the silicon substrate 1 on which device elements have been formed, and planarized. In the top surface of the interlayer insulating film 2, the first wiring 3 in buried with a flat surface by a dual damascene process. The forming process of the first wiring 3 will be explained in detail as follows.

First, wiring groove 21 is formed by lithography and RIE (Reactive Ion Etching) processes. Next, a TaN (and/or Ta) film serving an a barrier metal, and a Cu film serving as a wiring material film are successively deposited by PVD (Physical Vapor Deposition) methods so as to form a TaN/Cu film. Thereafter, a Cu film is buried in the wiring groove 21 by an electroplating method with employing the TaN/Cu film a an electrode. Finally, the deposited TaN/Cu film is planarized by a CMP (Chemical Mechanical Polishing) process to be buried only in the wiring groove 21, and the remaining film formed in the peripheral portion of the wiring groove 21 is removed. It should be appreciated that in order to connect the first wiring 3 to a diffusion layer formed on the substrate 1, a wiring contact hole will be formed in addition to the wiring grove by a dual damascene process.

Figure 4:
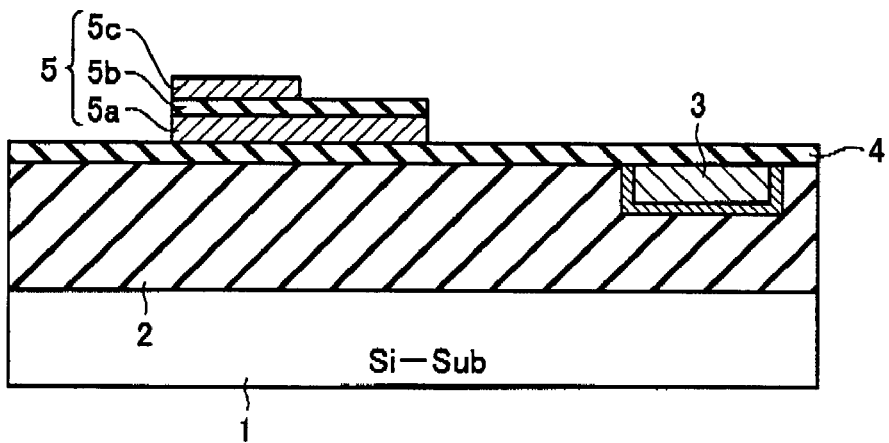
FIG. 4 shows a sectional view of the step of forming the MIM capacitor on the first interlayer insulating film on which the first wiring is formed.

Next, as shown in FIG. 4, after depositing a SiN film serving as the block insulating file 4 of about 0.1 μm in thickness to cover the first wiring 3, the MIM capacitor 5 is formed thereon. In detail, first TiN film serving as the bottom electrode 5a, SiN film serving an the dielectric film 5b and second TiN film serving as the top electrode 5c are successively deposited. For example, the bottom electrode 5a is formed of about 0.3 μm, and the total thickness of the dielectric film 5b and the top electrode 5c is about 0.1 μm. This stacked film of TiN/SiN/TiN is patterned by lithography and RIE with a chlorine (Cl) containing gas, whereby the top electrode 5c is formed. Sequentially perform lithography and RIE with a carbon fluoride (CF) containing gas, and the dielectric film 5b is patterned. Finally, by performing lithography and RIE with a Cl containing gas, the bottom electrode 5a is patterned.

Figure 5:
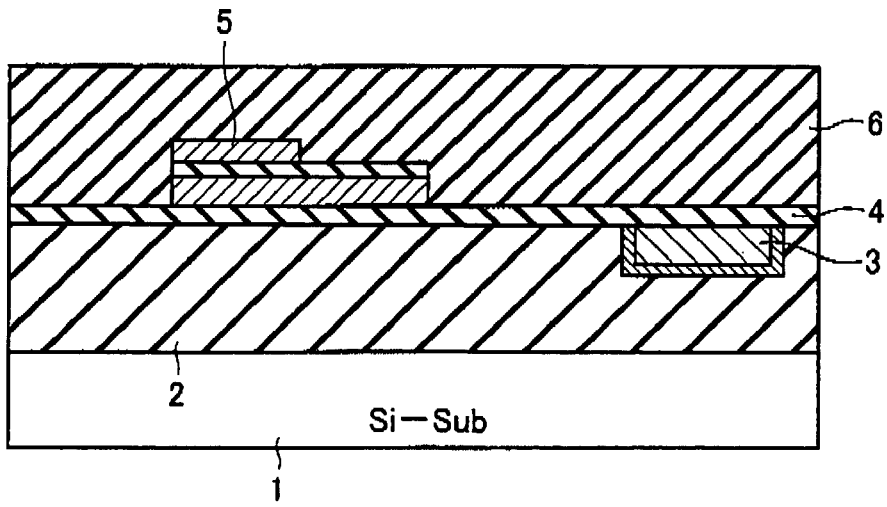
FIG. 5 shows a sectional view of the step of forming the second interlayer insulating film covering the MIM capacitor.

Next, as shown In FIG. 5, the second interlayer insulating film 6 is deposited over the substrate to cover the MIM capacitor 5, and planarized by a CMP process. This interlayer insulating film 6 is one selected in FSG film, C containing silicon oxide film and porous silicon oxide film. To make the CMP planarization of these films easy, a normal TEOS-SiO₂ film may be deposited on these low dielectric constant films.

Deposition methods of these interlayer insulating films 6 are as follows. Preferably, the FSG film is deposited by use of a parallel plate-type plasma CVD apparatus by supplying a fluorine (F) containing gas with SiH₄ contained as a main material gas to it. Employ this deposition method, and the FSG film is formed without film peeling and with a firm contact. C containing silicon oxide film may be deposited a CVD method with Black-diamond (trade name of Applied Materials, Inc.) employed as a main material. To form the porous silicon oxide film, an organic SOG (Silicon-On-Glass) film is deposited, and then processed by foaming reaction with heat treatment or by energy beam application so as to turn into a porous film.

Figure 6:
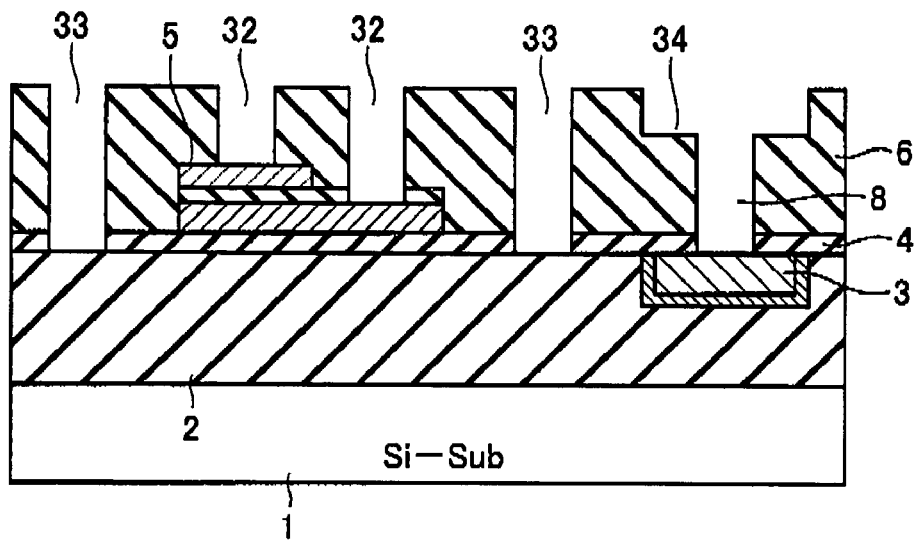
FIG. 6 shows a sectional view of the step of forming the via hole, guard ring groove and wiring groove in the second interlayer Insulating film.

Next, second wirings 12, metal ring 9 and contact plugs 10 are formed in the interlayer insulating film 6 by a dual damascene process. This process will be described in detail bellow. As shown in FIG. 6, wiring via hole 8, electrode contact holes 32 and guard ring groove 33 are simultaneously formed in the interlayer insulating film 6 by lithography and RIE. The guard ring groove 33 is formed in such a manner that bottom thereof is positioned under the bottom surface of the MIM capacitor 5 to expos the underlying interlayer insulating film 2. The via hole 8 and contact holes 32 are formed of 0.2 μm in diameter, and the guard ring groove 33 is formed of 1 μm in width. Successively, a wiring groove 34 is formed as being continued from the via hole 8 by lithography and RIE with a CF containing gas.

Figure 7:
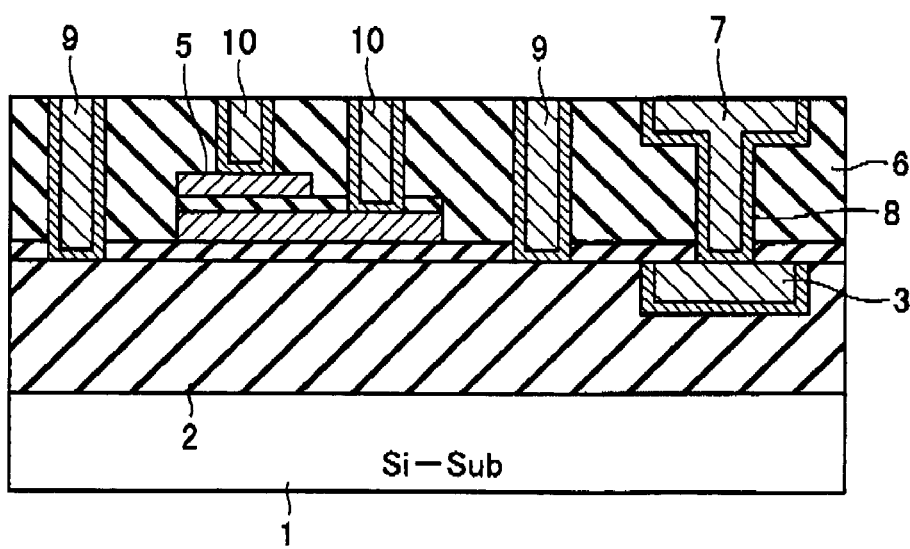
FIG. 7 shows a sectional view of the step of burying metal in the via hole, guard ring groove and wiring groove.

Next, a TaN (and/or Ta) film serving as the barrier metal and a Cu film serving as the wiring material film are sequentially deposited by a PVD method. By employing the produced TaN/Cu film as an electrode, a main Cu film is deposited and buried in the wiring groove 34, via hole 8, contact holes 32 and guard ring groove 33 by an electroplating method. The resultant TaN/Cu film is planarized by a CMP process. As a result of removing excess TaN/Cu film, as shown in FIG. 7, contact plugs 10 for the MIM capacitor 5, metal ring 9 surrounding the MIM capacitor 5 and wiring 7 are simultaneously buried in the interlayer insulating film 6 with a flat surface.

As described above, in this embodiment, wiring connection for the MIM capacitor 5 is not done in the wiring burying process in the interlayer Insulating film 6 covering the MIM capacitor 5. In the region of the MIM capacitor 5, only the above-described burying process of contact plugs 10 is performed. Electrical connection to the MIM capacitor 5 will be performed in the next third wiring forming process. As a result, the interlayer insulating film 6 may be formed to be thin as permitting such a situation that the bottom of the second wiring 7 is positioned lower than the top surface of the MIM capacitor 5.

Figure 8:
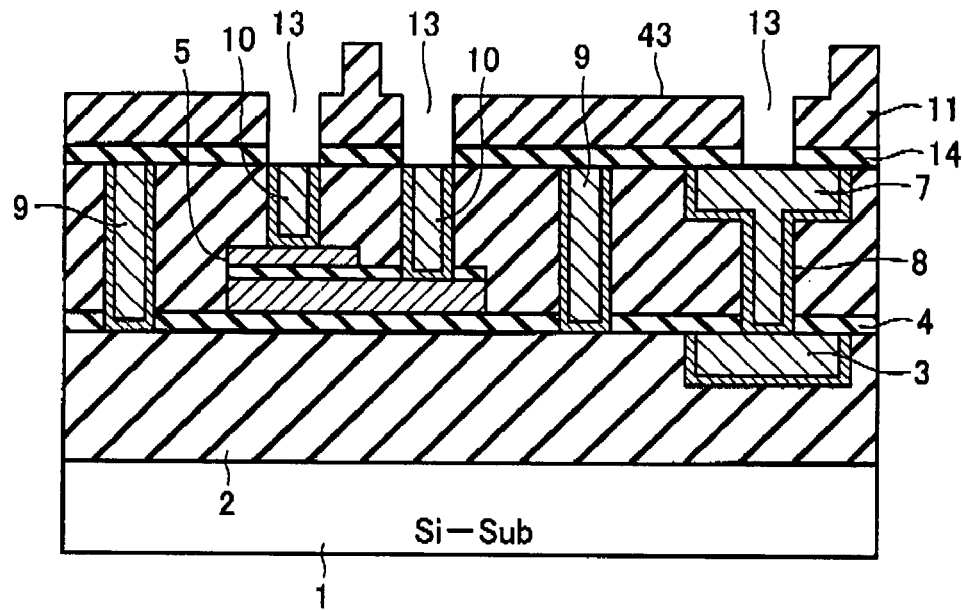
FIG. 8 shows a sectional view of the steps of forming the third interlayer insulating film covering the second wiring, and forming the via hole and wiring groove therein.

Next, as shown in FIG. 8, a SiN film serving as a block insulating film 14 and a TEOS-SiO$_2$ film serving as the third interlayer insulating film 11 are deposited over the second interlayer insulating film 6. In a top surface of the interlayer insulating film 11, th third wirings 12 is formed by a damascene process for electrically connecting at least one of the first and second wirings 3 and 7 to the MIM capacitor 5. In detail, as shown in FIG. 8, wiring via holes 13 and wiring grooves 43 continued therefrom are successively formed in the interlayer insulating film 11 by RIE. No via holes are formed on the metal ring 9, thereby resulting that the metal ring 9 is in an electrically floating state.

Figure 9:
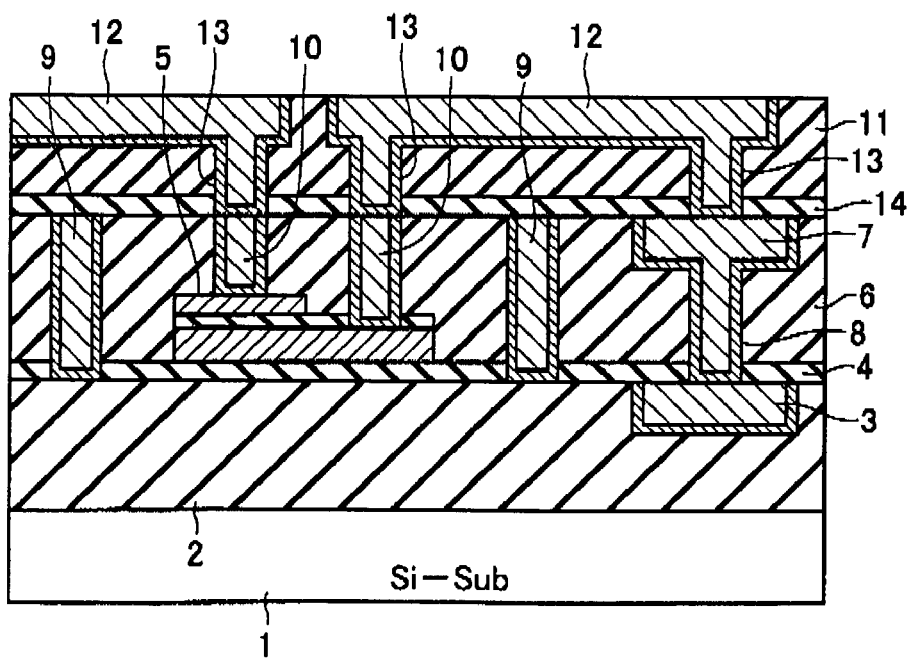
FIG. 9 shows a sectional view of the step of forming the third wiring.

Then, by employing the same process as the second wiring burying, the third wirings 12 formed of a TaN/Cu film is buried, as shown in FIG. 9, in the via holes 13 and wiring groove 43. The third wirings 12 are electrically connected to the top and bottom electrodes of the MIM capacitor 5 via the contact plugs 10 previously buried in the second interlayer insulating film 6 in the second wiring forming process. In a case that the third wirings 12 should be formed to electrically connect the first wiring 3 to the MIM capacitor 5, the same process as above-described one may be used.

Although the remaining processes are not shown in the drawings, a passivation film is deposited with SiO$_2$ and SiN films as being stacked by plasma CVD process. The passivation film is subjected to sinter annealing of 60 minutes under a H$_2$ gas atmosphere of 400° C. Finally, terminal pads are formed.

As described above, according to the embodiment, the guard ring is buried in the interlayer insulating film covering the MIM capacitor, whereby the reliability of the MIM capacitor becomes high. The reason of this will be described in detail bellow. In order to reduce the capacitance between multi-layered wirings, it is preferable, as previously described, to use a low dielectric constant insulating film for covering the MIM capacitor. However, low dielectric constant insulating films are in general inferior in step-coverage and weak in mechanical strength. Therefore, peeling and crack of the film are easily brought by an external stress.

Figure 10:
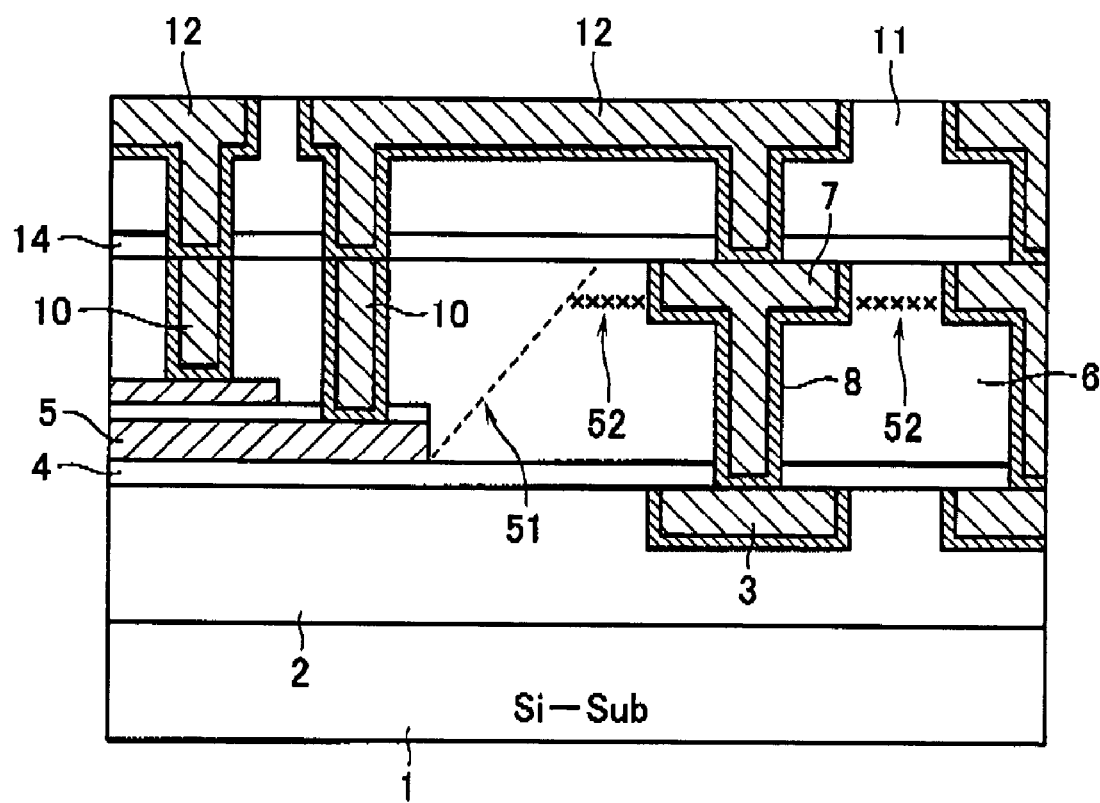
FIG. 10 shows a sectional view of a reference semiconductor device.

Corresponding to FIG. 2, FIG. 10 shows an integrated structure of Cu multi-layer wirings and an MIM capacitor, which is formed under the same condition as the above-described embodiment except that no guard rings ar formed. If the step coverage of the interlayer insulating film 6 covering the MIM capacitor 5 is insufficient, as shown in FIG. 10, a seam 51 is formed at the side step portion of the MIM capacitor 5. When a mechanical stress is applied to the interlayer insulating film 6 due to the contraction of the electrode of MIM capacitor 5 in a thermal process in future, a crack 52 is easily generated from the seam 51 which serves as the starting point to progress in the lateral direction in the insulating film 6, as shown in FIG. 10.

If the seam 51 or crack 52 reaches the wiring 7 or via hole 8, the barrier metal underlying the wiring will be cracked to cause Cu to be diffused into seam 51 and crack 52. This causes the wiring 7 and MIM capacitor 5 to be shortened or deteriorated in insulation therebetween. In addition, the low dielectric constant insulating film is low in the water permeability due to the fact that the density thereof is low. Therefore, after dicing the substrate into chips, water is easily diffused in the low dielectric constant film from the side surface of the chip. A high electric field is often applied to the MIM capacitor. Due to this, if water is diffused in the MIM capacitor portion, the breakdown voltage and reliability will be decreased.

According to this embodiment, even if a seam is generated in the interlayer insulating film 6 from the side surface portion of the MIM capacitor 5, the guard ring 9 cuts it. Due to this, crack generation may be prevented in the future thermal processes. Therefore, it becomes possible to prevent the MIM capacitor and wiring from shortening or deterioration in insulation therebetween. The guard ring also serves as a barrier for preventing water carried from the chip side from diffusing into the area of MIM capacitor. Therefore, time dependent deterioration of the MIM capacitor may be suppressed.

Furthermore, according to this embodiment, since the guard ring is formed of the same material at the same process as the wiring, there is no need for employing additional processes for forming the guard ring.

Although the guard ring is formed of the same Cu film as the damascene Cu wiring in the above-described embodiment, other materials, which are low in water permeability or able to prevent crack generation, may b used. Such materials are, for example, as follows: conductive materials such as tungsten (W) or Aluminum (Al); and insulator materials such as TEOS-SiO$_2$ or USG (Undoped Silicate Glass) formed by an HDP type plasma CVD apparatus. In a case of that the above-described materials different from the wiring material are employed for forming the guard ring, it is necessary to use an especial process in addition to the wiring formation process.

Hereinafter, some experimental examples and reference examples to be compared with them will be explained. In every chip areas of test wafers of the experimental examples and reference examples, one hundred MIM capacitors, each of which is patterned into a rectangular of 10×10 μm$^2$, are arranged in a matrix manner of 10×10 with a space of 2 μm, and three-layer Cu wirings are formed therein.

EXPERIMENTAL EXAMPLE 1

In the test wafer of Experimental Example 1, FSG film was used as the second interlayer insulating film 6, which was deposited of 0.6 μm in thickness by a parallel plate-type plasma CVD apparatus. Each of the MIM capacitors was surrounded by metal ring 9 formed at the same time as the second wiring. It was confirmed each chip diced from the test wafer having good initial properties, and with no defects such as wiring shortening/opening. As a result of breakdown voltage test, no defects were generated until 50V. Further, as a result of a TDDB (Time Dependent Dielectric Breakdown) test with 20V applying to the MIM capacitors, it was defined that the lifetime is 10 years or more.

EXPERIMENTAL EXAMPLE 2

In the test wafer of Experimental Example 2, a stacked structure of a film formed from Black-diamond and a TEOS-SiO$_2$ film was used as the second interlayer insulating film 6. Other conditions were the same as the test wafer of Experimental Example 1. The same tests as the Experimental Example 1 were done for chips diced from the test wafer. Good results as similar to Experimental Example 1 were confirmed in both of breakdown voltage test and TDDB test. As a result of a high humidity test under a condition of 30° C. and 90%, it was not found a significant property change of the MIM capacitors after a lapse of 500 hours.

REFERENCE EXAMPLE 1

The test wafer of Reference Example 1 was formed under the same condition as Experimental Example 1 except that no metal rings were formed. The same tests as the Experimental Example 1 were done for chips diced out the test wafer. There were no problems for initial properties as similar to Experimental Example 1. In a breakdown voltage test, defective chips were found from about 10V. As a result of analyzing the defective portions, it was confirmed that seams had been generated from the side surface portions of MIM capacitors in the direction of 45°, and cracks had been generated from the seams. According to EDX analyzing, it was confirmed Cu diffusion in the crack.

REFERENCE EXAMPLE 2

The test wafer of Reference Example 2 was formed under the same condition as Experimental Example 2 except that no metal rings are formed. The same tests as the Experimental Example 2 were done for chips diced out the test wafer. In a breakdown voltage test, defective chips were found from about 10V. As a result of high humidity test under a condition of 30° C. and 90%, it was found a significant property change of the MIM capacitors before a lapse of 500 hours.

REFERENCE EXAMPLE 3

The test wafer of Reference Example 3 was formed under the same condition as Experimental Example 1 except the deposition condition of the PSG film. In detail, FSG film was deposited from S1OF by an HDP type plasma CVD apparatus. The relative dielectric constant (k) of this FSG film was 3.5 or less. However, in the CMP process of the FSG film, peeling thereof was generated, and the step progress resulted in impossibility.

What is claimed is:

1. A semiconductor device comprising:
   a semiconductor substrate;
   a first wiring formed above said semiconductor substrate with a first insulating film interposed therebetween;
   an MIM capacitor formed above said first insulating film;
   a second insulating film formed above said MIM capacitor;
   a second wiring formed on said second insulating film; and
   a guard ring buried in said second insulating film, the guard ring surrounding a single said MIM capacitor and penetrating said second insulating film from its top to its bottom;
   wherein said guard ring is provided such that said guard ring is electrically insulated from said first wiring, said second wiring, and said MIM capacitor.

2. The semiconductor device according to claim 1, wherein
   said second wiring is connected to said first wiring via a hole formed in said second insulating film.

3. The semiconductor device according to claim 2, wherein
   said guard ring is a metal ring formed of the same material as said second wiring, said metal ring being buried in said second insulating film so as to penetrate through said second insulating film.

4. The semiconductor device according to claim 3, wherein
   said metal ring is in an electrically floating state.

5. The semiconductor device according to claim 3, wherein
   said second wiring and metal ring are formed of copper layers with barrier metals formed thereunder.

6. The semiconductor device according to claim 1, wherein
   the relative dielectric constant of said second insulating film is equal to 3.5 or less.

7. The semiconductor device according to claim 6, wherein
   said second insulating film is a fluorine containing silicon oxide film.

8. The semiconductor device according to claim 6, wherein
   said second insulating film is a carbon containing silicon oxide film.

9. The semiconductor device according to claim 6, wherein
   said second insulating film is a porous silicon oxide film.

10. The semiconductor device according to claim 1, wherein
    said guard ring is so disposed as to cut a seam generated in said second insulating film around said MIM capacitor.

11. The semiconductor device according to claim 1, wherein a width of said guard ring is in a range of 0.1 to 1 μm.

12. The semiconductor device according to claim 1, further comprising:
    a block insulating film formed between said first and second insulating film to cover said first wiring.

13. The semiconductor device according to claim 1 further comprising:
    contact plugs formed of the same material as said second wiring and buried in said second insulating film to be contacted to bottom and top electrodes of said MIM capacitor;
    a third insulating film formed over said second insulating film to cover said second wiring; and
    a third wiring formed on said third insulating film to electrically connect at least one of said first and second wirings to said MIM capacitor.

14. The semiconductor device according to claim 13, wherein
    said third wiring is coupled to said MIM capacitor via said contact plugs.

* * * * *